United States Patent [19]
Terazono

[11] Patent Number: 5,483,089
[45] Date of Patent: Jan. 9, 1996

[54] ELECTRICALLY ISOLATED MESFET

[75] Inventor: Shinichi Terazono, Itami, Japan

[73] Assignee: Mitsubishi Denki Kabushiki Kaisha, Tokyo, Japan

[21] Appl. No.: 22,309

[22] Filed: Feb. 25, 1993

[30] Foreign Application Priority Data

Aug. 11, 1992 [JP] Japan .................................. 4-236556

[51] Int. Cl.⁶ ............................ H01L 29/80; H01L 29/06; H01L 23/48; H01L 29/417
[52] U.S. Cl. ........................ 257/195; 257/192; 257/20; 257/24; 257/745
[58] Field of Search .............................. 257/20, 24, 192, 257/194, 743, 744, 745, 195, 499, 500, 501

[56]  References Cited

U.S. PATENT DOCUMENTS

| | | | |
|---|---|---|---|
| 4,843,033 | 6/1989 | Plumton et al. | 257/279 |
| 4,935,797 | 6/1990 | Jambotkar | 257/745 |
| 4,961,194 | 10/1990 | Kuroda et al. | 257/24 |
| 5,012,318 | 4/1991 | Honjo | 257/195 |
| 5,014,108 | 5/1991 | O'Mara, Jr. et al. | 257/272 |
| 5,151,757 | 9/1992 | Enoki et al. | 257/194 |
| 5,162,877 | 11/1992 | Mori | 257/194 |
| 5,243,207 | 9/1993 | Plumton et al. | 257/192 |
| 5,422,501 | 6/1995 | Bayraktaroglu | 257/195 |

FOREIGN PATENT DOCUMENTS

| | | |
|---|---|---|
| 61-131526 | 6/1986 | Japan . |
| 63-104485 | 5/1988 | Japan . |
| 366135 | 3/1991 | Japan . |
| 3270155 | 12/1991 | Japan . |

*Primary Examiner*—Robert P. Limanek
*Assistant Examiner*—David B. Hardy
*Attorney, Agent, or Firm*—Leydig, Voit & Mayer

[57]  ABSTRACT

An electrically isolated MESFET includes a compound semiconductor substrate; a plurality of compound semiconductor layers disposed on the compound semiconductor substrate; a MESFET structure in a prescribed region of the compound semiconductor layers; an electrically isolating region in the compound semiconductor layers surrounding and electrically isolating the MESFET structure from the compound semiconductor layers outside the electrically isolating region, wherein the compound semiconductor layer most remote from the compound semiconductor substrate has the highest conductivity of the compound semiconductor layers; a recess penetrating the compound semiconductor layer most remote from the compound semiconductor substrate and at least the compound semiconductor layer adjacent the compound semiconductor layer most remote from the compound semiconductor substrate, the recess dividing the compound semiconductor layer most remote from the compound semiconductor substrate into mutually separated first and second parts; a gate electrode disposed in the recess, contacting and forming a Schottky barrier with one of the compound semiconductor layers; and source and drain electrodes respectively disposed on and contacting the first and second parts of the compound semiconductor layer most remote from the compound semiconductor substrate.

6 Claims, 5 Drawing Sheets

ELECTRICALLY ISOLATED MESFET

FIELD OF THE INVENTION

The present invention relates to a semiconductor device and a production method thereof in which a device is formed in a prescribed region of compound semiconductor layers grown on a semiconductor substrate and, more particularly, to a method of isolating the device from other regions on the semiconductor substrate.

BACKGROUND OF THE INVENTION

FIGS. 5(a) to 5(c) are diagrams illustrating a high electron mobility transistor (hereinafter referred to as HEMT) formed on an InP substrate included in a prior art semiconductor device, in which FIG. 5(a) is a top plan view and FIGS. 5(b) and 5(c) are sectional views taken along lines Vb—Vb and Vc—Vc of FIG. 5(a), respectively. In these figures, a mesa structure comprising compound semiconductor layers, i.e., an intrinsic (hereinafter referred to as i type) InAlAs buffer layer 2, an i type InGaAs channel layer 3, an i type InAlAs spacer layer 4, an n type InAlAs electron supply layer 5, an i type InAlAs Schottky formation layer 6, an n type InAlAs layer 7, and a low-resistance n type InGaAs contact layer 8 with carrier concentration of $2 \times 10^{19}$ cm$^3$, is disposed on a portion of the InP substrate 1. A recess 11 penetrates through the InGaAs contact layer 8 and the InAlAs layer 7 and reaches into the Schottky formation layer 6. A gate electrode 10 is disposed on the Schottky formation layer 6 in the bottom of the recess 11. Source and drain electrodes 9a and 9b are disposed on the mesa structure where the recess 11 is absent and extended onto portions of the substrate 1. Preferably, the i type InAlAs buffer layer 2 is 1000~1500 angstroms thick and each of the layers disposed on the buffer layer 2 is 100~400 angstroms thick. Source and drain regions are formed in the n type InAlAs layer 7. Reference numeral 10a designates a bonding pad at an end of the gate electrode 10, to which wires from external devices or devices disposed on other regions of the InP substrate 1 are bonded.

FIGS. 6(a) to 6(d) illustrate process steps in a method of producing the HEMT. In the figures, the same reference numerals as in FIGS. 5(a) to 5(c) designate the same or corresponding parts, and reference numeral 12 designates a photoresist pattern.

Initially, there are successively grown on the InP substrate 1, the i type InAlAs buffer layer 2, the i type InGaAs channel layer 3, the i type InAlAs spacer layer 4, the n type InAlAs electron supply layer 5, the i type InAlAs Schottky formation layer 6, the n type InAlAs layer 7, and the n type InGaAs contact layer 8, preferably by metal organic chemical vapor deposition (MOCVD). Then, a photoresist pattern 12 is formed on the n type InGaAs contact layer 8 by a conventional photolithographic technique. Using the photoresist pattern 12 as a mask, the semiconductor layers 2 to 8 are wet etched using tartaric acid or the like as an etchant to form the semiconductor layers 2 to 8 in a mesa shape as shown in FIG. 6(a). Thus, the mesa-shaped semiconductor layers are isolated from other regions on the InP substrate 1. Then, as shown in FIG. 6(b), the source and drain electrodes 9a and 9b are formed on prescribed regions on the n type InGaAs contact layer 8, extending onto the surface of the InP substrate 1. Then, recess etching is carried out from the surface of the contact layer 8 while measuring a current flowing between the source and drain electrodes 9a and 9b, whereby the thickness of the i type InAlAs Schottky formation layer 6 in a gate region is adjusted to a desired thickness, resulting the recess 11 shown in FIG. 6(c). Thereafter, the gate electrode 10 is formed on the i type InAlAs Schottky formation layer 6 exposed on the bottom of the recess 11 using a lift-off process.

In operation, when a bias voltage is applied between the source and drain electrodes 9a and 9b, a two-dimensional gas serving as a channel is formed in the i type InGaAs channel layer 3 in the vicinity of its boundary with the i type InAlAs spacer layer 4, and a current flows through the channel. This current is controlled by a voltage applied to the gate electrode 10 to operate the transistor.

In a semiconductor device produced by successively growing compound semiconductor layers on a semiconductor substrate and forming a device in a prescribed region of the compound semiconductor layers, like the above-described semiconductor device in which the HEMT is formed on the InP substrate, the thickness of the compound semiconductor layers must be larger than 0.2 micron. In addition, in a field effect transistor having a recessed gate, like the above-described HEMT, the thickness of semiconductor layers between the bottom of the recess, on which the gate electrode is formed, and the surface of the semiconductor substrate must be larger than 0.2 micron.

Therefore, in a structure as shown in FIG. 5(b), in which compound semiconductor layers on a semiconductor substrate are formed into a mesa by etching to isolate a device from other regions on the substrate, the difference in levels between the surface of the semiconductor substrate and the top of the mesa is more than 0.2 micron. In FIG. 5(b), since the HEMT includes the recessed gate, the difference in levels between the surface of the semiconductor substrate and the bottom of the recess is more than 0.2 micron. In this structure, when an electrode is formed on the surface of the mesa or on the bottom of the recess extending onto the surface of the substrate, a lift-off process is usually employed as described above. More specifically, a photoresist film is formed on the mesa and its periphery, and a prescribed portion of the photoresist film is opened by a photolithographic technique to form a mask pattern. Then, a metal for the electrode is deposited via the mask pattern, followed by removal of the mask pattern, resulting in an electrode.

In forming a photoresist pattern by the above-described photolithographic technique, a reducing projection exposure apparatus is generally used for the exposure process, and a resolution limit R of the reducing projection exposure apparatus is represented as follows:

$$R = k1 \ \lambda/NA \quad (1)$$

where NA is a numerical aperture of a projection lens, $\lambda$ is the wavelength of the exposure light, and k1 is a constant indicating lens performance, which is 0.612 in a case of a spherical projection lens according to a theory by Rayleigh. It is known that it is possible to form a fine exposure pattern by increasing the numerical aperture (NA), according to the equation (1).

In forming a photoresist pattern on a substrate having a level difference of 0.2 micron or more, however, the depth of focus is reduced by increasing the numerical aperture (NA), resulting in an insufficient exposure intensity. This makes it very difficult to project a fine exposure pattern having constant light intensity on the substrate having a level difference of 0.2 micron or more. Therefore, in forming a photoresist pattern having an opening of 0.25 micron or below in width, a uniform width of the opening pattern is not obtained and the width also varies in a depth direction of the opening pattern. In this way, in forming the gate electrode 10 on the bottom surface of the recess 11 extending onto the surface of the InP substrate 1 in a lift-off process in the formation of the HEMT, if the opening of the photoresist pattern is fine-patterned in accordance with a desired gate electrode width of 0.25 micron or below, the resulting gate electrode is not uniform in its thickness and width and, in some cases, the gate electrode is discontinuous at the edge of the mesa structure, resulting in a HEMT with poor reliability.

It is thought that this problem may be avoided if the device is isolated by implanting ions into regions where the device is not formed so that the ions pentrate to the substrate. In the InP system HEMT with the n type InGaAs layer 8 for contacting with electrodes as an uppermost layer, however, the n type InGaAs layer is not insulated by ion implantation, so the HEMT is not completely isolated. When compositions of the respective compound semiconductor layers are determined so that these layers can be insulated by ion implantation, the compositions of the respective layers do not produce preferred device characteristics.

SUMMARY OF THE INVENTION

An object of the present invention is to provide a semiconductor device in which a level difference due to a device formed on a substrate is reduced and the device is completely isolated from other regions on the substrate.

Another object of the present invention is to provide a method for producing the semiconductor device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, in a method of producing a semiconductor device, when a device is formed in a prescribed region of compound semiconductor layers including a low resistance layer which cannot be insulated by ion implantation, upper layers of the compound semiconductor layers including at least the low resistance layer are formed into a mesa shape by etching, and then ions are implanted in the compound semiconductor layers other than those beneath the mesa structure, whereby the device is completely isolated from other regions on the semiconductor substrate. Thus, the device on the substrate is isolated from other regions on the substrate using mesa-etching and ion implantation, so that a level difference on the substrate due to the device is within a range that does not adversely affect the subsequent process steps, for example, producing electrodes. In addition, materials and compositions of the compound semiconductor layers isolated by mesa-etching are selected according to desired device characteristics, without consideration of forming insulation regions by ion implantation.

BRIEF DESCRIPTION OF THE DRAWINGS

FIGS. 1(a) to 1(c) are diagrams illustrating a HEMT formed on an InP substrate included in a semiconductor device in accordance with a first embodiment of the present invention, in which FIG. 1(a) is a top plan view and FIGS. 1(b) and 1(c) are sectional views taken along lines Ib—Ib and Ic—of FIG. 1(a), respectively;

FIGS. 5(a) to 5(c) are diagrams illustrating a HEMT on an InP substrate included in a prior art semiconductor device, in which FIG. 5(a) is a top plan view and FIGS. 5(b) and 5(c) are sectional views taken along lines Vb—Vb and Vc—Vc of FIG. 5(a), respectively.

DETAILED DESCRIPTION OF THE PREFERRED EMBODIMENTS

Figure 1A:
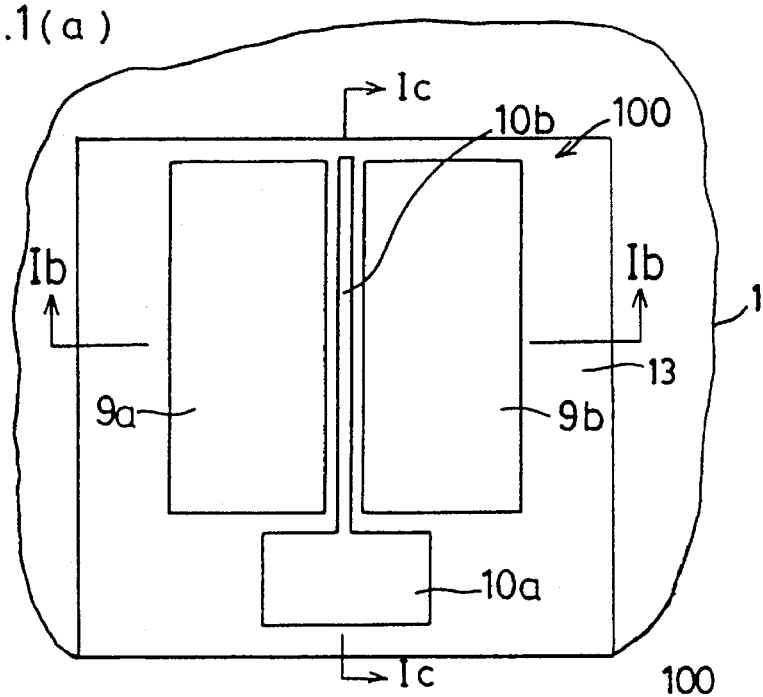
Figure 1B:
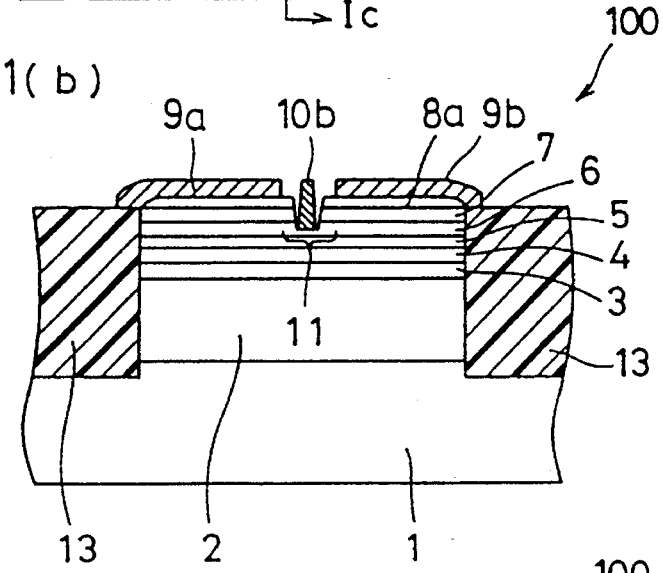
Figure 1C:
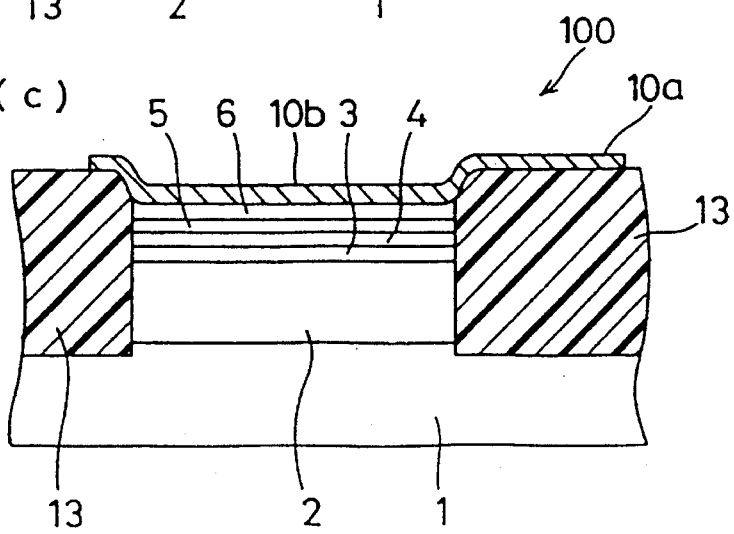

FIGS. 1(a) to 1(c) illustrate a HEMT formed on an InP substrate included in a semiconductor device in accordance with a first embodiment of the present invention, in which FIG. 1(a) is a top plan view and FIGS. 1(b) and 1(c) are sectional views taken along lines Ib—Ib and Ic—Ic of FIG. 1(a), respectively. In the figures, successively disposed on an InP substrate 1 are an i type InAlAs buffer layer 2, an i type InGaAs channel layer 3, an i type InAlAs spacer layer 4, an n type InAlAs electron supply layer 5, an i type InAlAs Schottky formation layer 6, an n type InAlAs layer 7, and an n type InGaAs contact layer 8a. Source and drain electrodes 9a and 9b are disposed on the n type InGaAs contact layer 8a and make an ohmic contact with the contact layer 8a. A recess 11 penetrates through the n type InGaAs contact layer 8a and the n type InAlAs layer 7 and reaches into the i type InAlAs Schottky formation layer 6. A gate electrode 10b having a width of 0.25 micron or below is disposed on the i type InAlAs Schottky formation layer 6 on the bottom surface of the recess 11. Reference numeral 13 designates an insulating region for isolating the HEMT 100, which is formed by ion implantation. Source and drain regions are formed in the n type InAlAs layer 7. In addition, the i type InAsAs buffer layer 2 is 1000~1500 angstroms thick, and each of the layers disposed on the buffer layer 2 is 100~400 angstroms thick. The resistance of the n type InGaAs contact layer 8a is reduced by increasing the charge carrier concentration thereof to the order of $1 \times 10^{20}/cm^3$, whereby the source and drain electrodes 9a and 9b make ohmic contact with the contact layer 8a. The contact layer 8a is patterned so that edges of the contact layer are aligned with edges of the insulating region 13.

A method of manufacturing the HEMT of FIGS. 1(a) to 1(c) is illustrated in FIGS. 2(a) to 2(d).

Figure 2A:
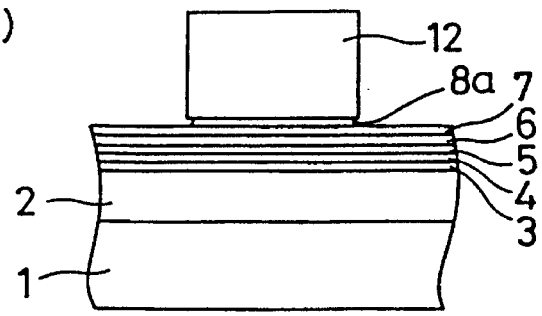
FIGS. 2(a) to 2(e) are sectional views illustrating process steps in a method of producing the HEMT of FIGS. 1(a) to 1(c)

Initially, as illustrated in FIG. 2(a), there are successively grown on on the InP substrate 1, the i type InAlAs buffer layer 2, the i type InGaAs channel layer 3, the i type InAlAs spacer layer 4, the n type InAlAs electron supply layer 5, the i type InAlAs Schottky formation layer 6, the n type InAlAs layer 7, and the n type InGaAs contact layer 8a. Preferably, these layers are grown by MOCVD. Then, a photoresist pattern 12 is formed on the n type InGaAs contact layer 8a by a conventional photolithographic technique. Then, using the photoresist pattern 12 as a mask, the n type InGaAs contact layer 8a is selectively wet etched using citric acid as an etchant.

Figure 2B:
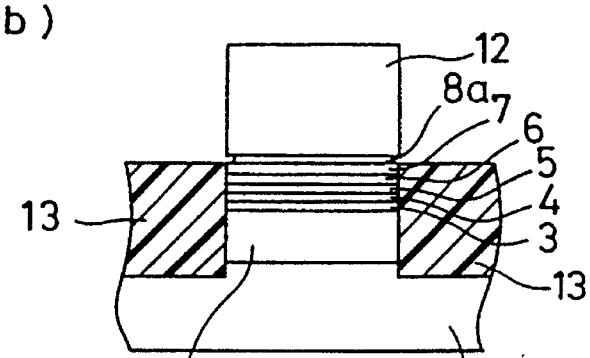

Thereafter, ion implantation is performed using the photoresist pattern 12 as a mask to form the insulating region 13 penetrating through the semiconductor layers 2 to 7 and reaching into the InP substrate 1 as illustrated in FIG. 2(b). Here, the n type InGaAs layer 8a which is etched by the wet etching is a layer which cannot be insulated by ion implantation because of its high charge carrier concentration. Preferably, one of hydrogen (H) ions, boron (B) ions, and iron (Fe) ions, or a combination thereof is used as the implanted ion.

Figure 2C:
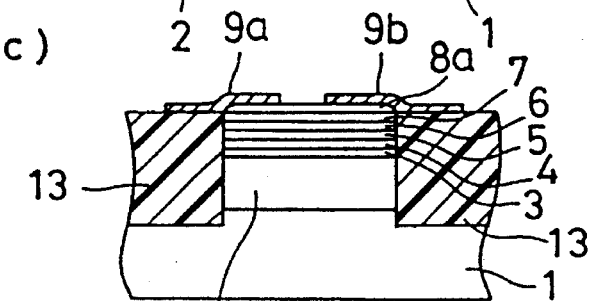

After removing the photoresist pattern 12, the source and drain electrodes 9a and 9b comprising Au alloy or Ag alloy that make ohmic contact with the n type InGaAs contact layer 8a are formed on the contact layer 8a and portions of the insulating region 13 by a lift-off process, as illustrated in FIG. 2(c).

Figure 2D:
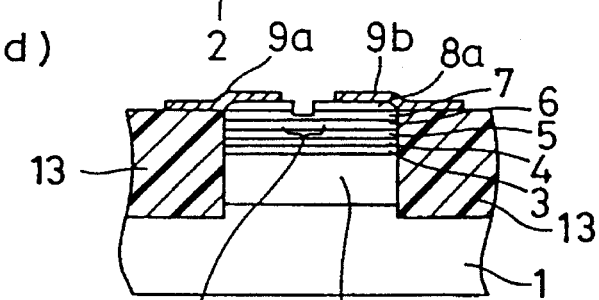

Then, recess etching is carried out from the surface of the contact layer 8a while measuring a current flowing between the source and drain electrodes 9a and 9b, whereby the thickness of the i type InAlAs Schottky formation layer 6 in a gate region is adjusted to a desired thickness, resulting in the recess 11 shown in FIG. 2(d).

Figure 2E:
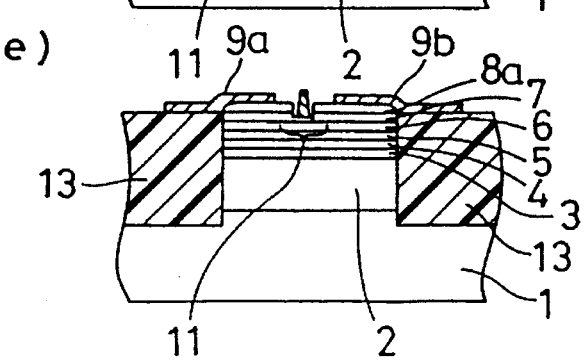

Then, as illustrated in FIG. 2(e), the gate electrode 10b having a width of 0.25 micron or below is formed on the Schottky formation layer 6 in the bottom of the recess 11 in a lift-off process. In the formation of the gate electrode 10b, the aperture width of a photoresist pattern used for selectively depositing an electrode metal in the recess is 0.25 micron or below. However, during an exposure process for forming the photoresist pattern, the difference in levels between the surface of the insulating region 13 and the surface of the Schottky formation layer 6 in the bottom of the recess 11 is in a range of 200~800 angstroms. Therefore, the pattern exposure is carried out without a reduction in resolution and exposure intensity, whereby a photoresist pattern with a uniform aperture width is obtained. As the result, the gate electrode 10b having uniform width and thickness is formed with no discontinuity at the edge of the insulating region 13. At the same time, an electrode leading part 10a serving as a bonding pad is formed at an end of the gate electrode 10b. Then, wires from a device formed on another region on the InP substrate 1 or from an external device are bonded onto the bonding pad 10a.

In the semiconductor device according to the first embodiment of the present invention, the uppermost layer of the HEMT 100, i.e., the low resistance n type InGaAs contact layer 8a is isolated from other regions of the compound semiconductor layers by etching, and then the respective layers beneath the contact layer 8a are isolated by ion implantation, whereby the HEMT 100 is completely isolated on the InP substrate 1. In addition, when the gate electrode 10 having a width of 0.25 micron or below is formed on the i type InAlAs Schottky formation layer 6 in the bottom surface of the recess 11 in a lift-off process, extending onto the surface of the insulating region 13, the difference in levels between the bottom of the recess and the surface of the insulating region 13 is within a range of 200 to 800 angstroms. A high dimensional precision of the aperture of the photoresist pattern for forming the electrode results, and an electrode with uniform width and thickness is attained, with the result that characteristics of the HEMT are improved.

While in the first embodiment the i type InAlAs buffer layer 2 is 1000~1500 angstroms thick, the buffer layer 2 may be thicker than 1500 angstroms because the increase in the thickness of the buffer layer 2 does not affect the difference in levels between the bottom surface of the recess 11 and the surface of the insulating region 13. In this case, crystallinities of the semiconductor crystal layers 3 to 8a Grown on the buffer layer 2 are improved, with a result that characteristics of the HEMT are further improved.

Figure 3:
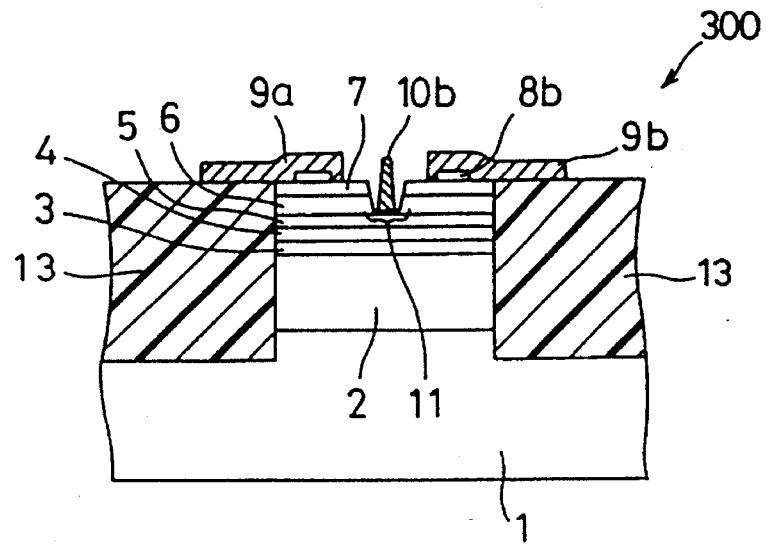
FIG. 3 is a sectional view illustrating a HEMT formed on an InP substrate included in a semiconductor device in accordance with a second embodiment of the present invention.

FIG. 3 is a sectional view illustrating a HEMT formed on an InP substrate included in a semiconductor device in accordance With a second embodiment of the present invention. In FIG. 3, the same reference numerals as in FIGS. 1(a) to 1(c) designate the same or corresponding parts. In this second embodiment, the n type InGaAs contact layer 8b of the HEMT 300 is narrower than the n type InGaAs contact layer 8a of the HEMT 100 of the first embodiment, the source and drain electrodes 9a and 9b are disposed over the n type InGaAs contact layer 8b, and the intervals between the gate electrode 10b and the source and drain electrodes 9a and 9b are wider than those of the HEMT 100 Of the first embodiment.

A method of manufacturing the HEMT 300 is identical to that of the previously described first embodiment except that photolithography and etching step reducing the width of the n type InGaAs contact layer 8b are carried out before the formation of the source and drain electrodes 9a and 9b.

According to the second embodiment of the present invention, the same effects as described in the first embodiment are obtained. In addition, since the width of the n type InGaAs contact layer 8b is narrower and the intervals between the gate electrode 10b and the source and drain electrodes 9a and 9b are wider than those of the HEMT 100 of the first embodiment, the gate junction breakdown voltage is increased, with the result that the characteristics of the HEMT are further improved.

Figure 4A:
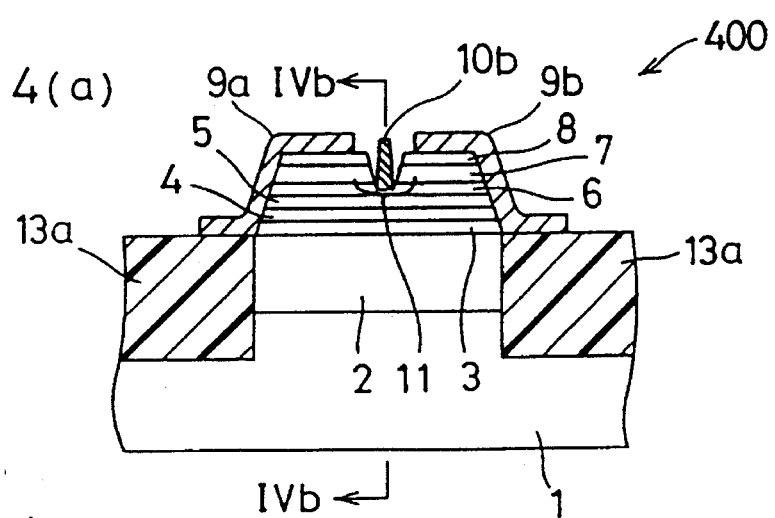
FIGS. 4(a) and 4(b) are sectional views illustrating a HEMT on an InP substrate included in a semiconductor device in accordance with a third embodiment of the present invention.
Figure 4B:
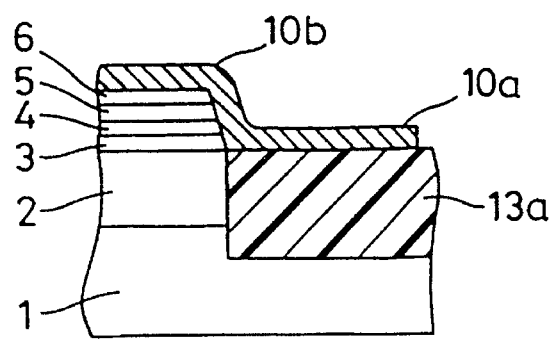
Figure 5A:
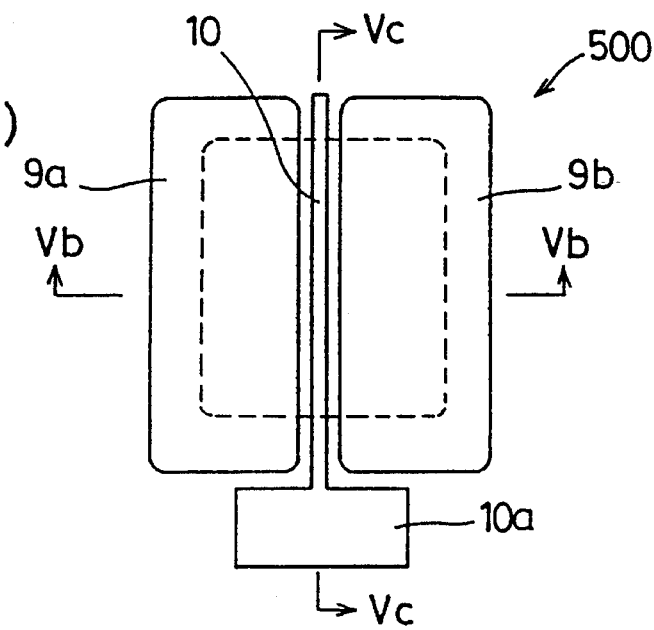
Figure 5B:
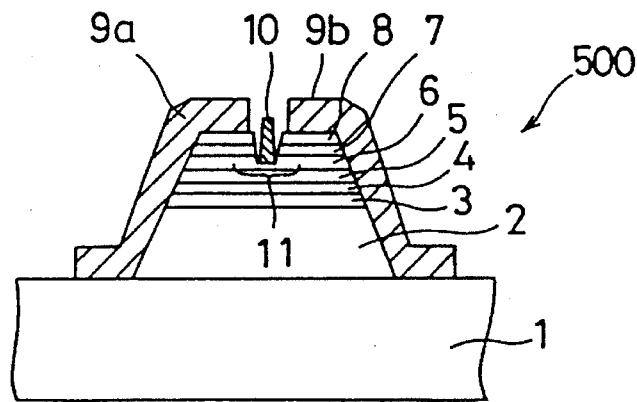
Figure 5C:
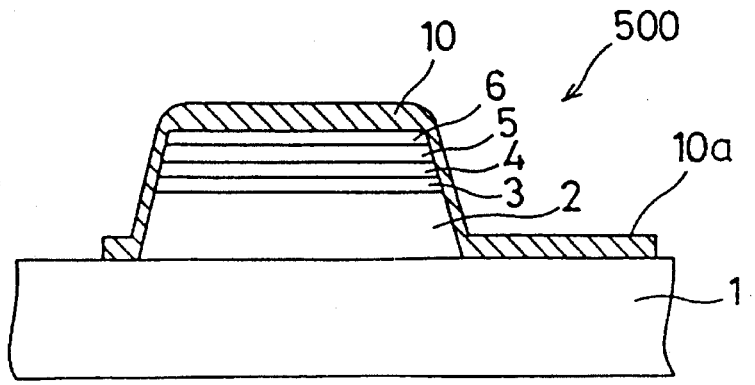

FIG. 4(a) is a sectional view illustrating a HEMT formed on an InP substrate included in a semiconductor device in accordance with a third embodiment of the present invention, and FIG. 4(b) is a sectional view taken along line IVb—IVb of FIG. 4(a). In these figures, the same reference numerals as in FIGS. 1(a) to 1(c) designate the same or corresponding parts. Reference numeral 13a designates an insulating region formed by ion implantation.

In this structure, the semiconductor layers on the i type InAlAs buffer layer 2 are formed in a mesa shape by etching, and a prescribed region 13a of the buffer layer 2 and the InP substrate 1 is insulated by ion implantation, whereby the HEMT 400 is isolated from other regions on the InP substrate 1. The gate electrode 10b having a width of 0.25 micron or below is disposed on the bottom surface of the recess 11 and extends onto the surface of the insulating region 13a.

Figure 6A:
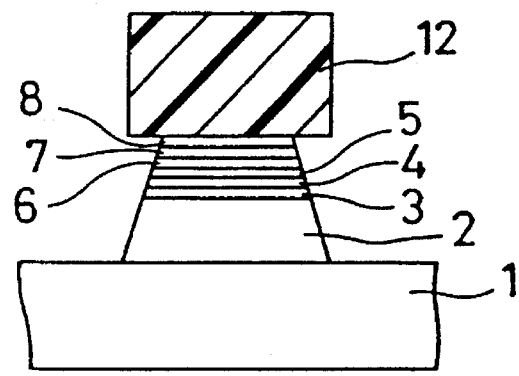
FIGS. 6(a) to 6(d) are sectional views illustrating process steps in a method of producing the HEMT of FIGS. 5(a) to 5(c).
Figure 6B:
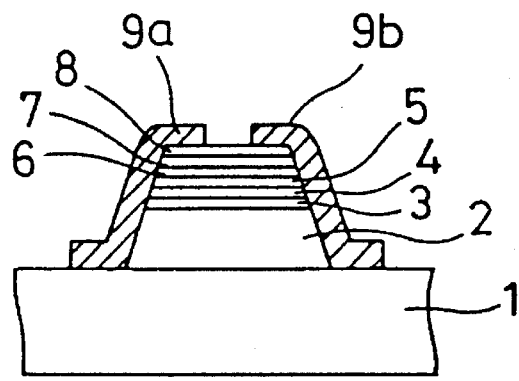
Figure 6C:
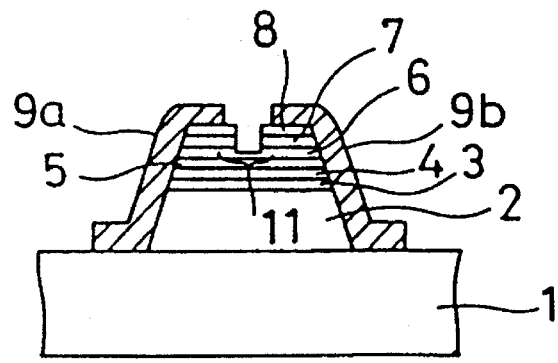
Figure 6D:
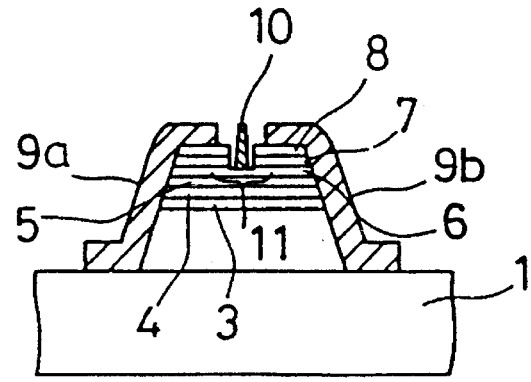

In producing the HEMT 400, the duration of the mesa-etching step of the compound semiconductor crystal layers is controlled in the step of FIG. 6(a) so as to stop the etching on the surface of the i type InAsAs buffer layer 2, and the insulating region 13a is formed by ion implantation. Thereafter, the source and drain electrodes 9a and 9b and the gate electrode 10b are formed to complete the HEMT 400.

According to the third embodiment of the present invention, in the conventional mesa-etching step of FIG. 6(a), the etching time is controlled so that the level difference on the substrate may not exceed 0.2 micron, differently from the selective etching in the first and second embodiments of the present invention. Therefore, the HEMT 400 which is completely isolated from other regions on the substrate is achieved in a simple process. In addition, the fine gate electrode 10b achieved in this embodiment has uniform width and continuity at the edge of the mesa structure because the difference in levels between the surface of the insulating region 13a and the bottom surface of the recess 11 is in a range of 400 to 1600 angstroms.

While in the above-described first to third embodiments the ion implantation is performed after the mesa-etching of the compound semiconductor layers, this order may be reversed.

While in the above-described first to third embodiments the HEMT is formed on the InP substrate, the present invention may be applied to other field effect transistors or other devices formed on semiconductor substrates comprising other materials.

As is evident from the foregoing description, according to the present invention, when a device is formed in a prescribed region of compound semiconductor layers including a low resistance layer which cannot be insulated by ion implantation, upper layers of the compound semiconductor layers including at least the low resistance layer are formed into a mesa shape by etching, and ions are implanted in the compound semiconductor layers other than those beneath the mesa structure, whereby the device is completely isolated from other regions on the semiconductor substrate. Therefore, a device structure with a small level difference is attained, resulting in a high-performance device.

In addition, according to the present invention, materials and compositions of the compound semiconductor layers isolated by mesa-etching are selected according to desired device characteristics without consideration of the production of insulating regions by ion implantation. Therefore, the degree of freedom in selecting materials and compositions of the compound semiconductor layers disposed on the semiconductor substrate increases, resulting in a high-performance device.

What is claimed is:

1. An electrically isolated MESFET comprising:

a compound semiconductor substrate;

a plurality of compound semiconductor layers disposed on the compound semiconductor substrate wherein each of the compound semiconductor layers has a respective conductivity and the compound semiconductor layer most remote from the compound semiconductor substrate has the highest conductivity of the compound semiconductor layers;

an electrically isolating region in the compound semiconductor layers surrounding and electrically isolating a MESFET region of the compound semiconductor layers from the compound semiconductor layers outside the electrically isolating region;

a recess penetrating the compound semiconductor layer most remote from the compound semiconductor substrate and at least the compound semiconductor layer adjacent the compound semiconductor layer most remote from the compound semiconductor substrate, the recess dividing the compound semiconductor layer most remote from the compound semiconductor substrate into mutually separated first and second parts;

a gate electrode disposed in the recess, contacting and forming a Schottky barrier with one of the compound semiconductor layers; and source and drain electrodes respectively disposed on and contacting the first and second parts of the compound semiconductor layer most remote from the compound semiconductor substrate wherein the gate electrode is separated from the compound semiconductor substrate by less than 200 nanometers.

2. An electrically isolated MESFET comprising:

a compound semiconductor substrate;

a plurality of compound semiconductor layers disposed on the compound semiconductor substrate wherein each of the compound semiconductor layers has a respective conductivity and the compound semiconductor layer most remote from the compound semiconductor substrate is n-type InGaAs and has the highest conductivity of the compound semiconductor layers, the compound semiconductor layers including an intrinsic InGaAs channel layer, an n-type InAlAs electron supply layer, an intrinsic InAlAs layer, and an n-type InAlAs contact layer successively disposed on the compound semiconductor substrate, the n-type InGaAs layer being disposed on and contacting the n-type InAlAs contact layer;

an electrically isolating region in the compound semiconductor layers surrounding and electrically isolating a MESFET region of the compound semiconductor layers from the compound semiconductor layers outside the electrically isolating region;

a recess penetrating the n-type InGaAs layer and at least the intrinsic InAlAs layer, the recess dividing the n-type InGaAs layer into mutually separated first and second parts;

a gate electrode disposed in the recess, contacting and forming a Schottky barrier with the intrinsic InAlAs layer; and source and drain electrodes respectively disposed on and contacting the first and second parts of the compound semiconductor layer most remote from the compound semiconductor substrate, the compound semiconductor layers forming a high mobility electron transistor structure.

3. The electrically isolated MESFET of claim 2 wherein the compound semiconductor substrate is InP and including an intrinsic InAlAs spacer layer disposed between the channel and electron supply layers and an InAlAs buffer layer disposed between the channel layer and the compound semiconductor substrate.

4. The electrically isolated MESFET of claim 2 wherein the electrically isolating region in the compound semiconductor layers includes an ion implanted electrically insulating region.

5. An electrically isolated MESFET comprising:

a compound semiconductor substrate;

a plurality of compound semiconductor layers disposed on the compound semiconductor substrate wherein each of the compound semiconductor layers has a respective conductivity and the compound semiconductor layer most remote from the compound semiconductor substrate has the highest conductivity of the compound semiconductor layers;

an electrically isolating region in the compound semiconductor layers surrounding and electrically isolating a MESFET region of the compound semiconductor layers from the compound semiconductor layers outside the electrically isolating region;

a recess penetrating the compound semiconductor layer most remote from the compound semiconductor substrate and at least the compound semiconductor layer adjacent the compound semiconductor layer most remote from the compound semiconductor substrate, the recess dividing the compound semiconductor layer most remote from the compound semiconductor substrate into mutually separated first and second parts;

a gate electrode disposed in the recess, contacting and forming a Schottky barrier with one of the compound semiconductor layers; and source and drain electrodes respectively disposed on and contacting and completely covering the first and second parts of the compound semiconductor layer most remote from the compound semiconductor substrate.

6. An electrically isolated MESFET comprising:

a compound semiconductor substrate;

a plurality of compound semiconductor layers disposed on the compound semiconductor substrate wherein each of the compound semiconductor layers has a respective conductivity and the compound semiconductor layer most remote from the compound semiconductor substrate has the highest conductivity of the compound semiconductor layers;

an electrically isolating region in the compound semiconductor layers surrounding and electrically isolating a MESFET region of the compound semiconductor layers from the compound semiconductor layers outside the electrically isolating region;

a recess penetrating the compound semiconductor layer most remote from the compound semiconductor substrate and at least the compound semiconductor layer adjacent the compound semiconductor layer most remote from the compound semiconductor substrate, the recess dividing the compound semiconductor layer most remote from the compound semiconductor substrate into mutually separated first and second parts;

a gate electrode disposed in the recess, contacting and forming a Schottky barrier with one of the compound semiconductor layers; and source and drain electrodes respectively disposed on and contacting the first and second parts of the compound semiconductor layer most remote from the compound semiconductor substrate, wherein the source and drain electrodes are each partially disposed on the electrically isolating region.

* * * * *